United States Patent [19]

Ohsawa et al.

[11] 4,435,611
[45] Mar. 6, 1984

[54] CONDUCTIVE PASTE

[75] Inventors: Kenji Ohsawa, Yokohama; Takao Ito; Shimetomo Fueki, both of Tokyo; Masayuki Osawa; Keiji Kurata, both of Atsugi, all of Japan

[73] Assignee: Sony Corporation, Tokyo, Japan

[21] Appl. No.: 452,611

[22] Filed: Dec. 23, 1982

Related U.S. Application Data

[62] Division of Ser. No. 246,902, Mar. 23, 1981, abandoned.

[30] Foreign Application Priority Data

Mar. 24, 1980 [JP] Japan .................. 55-37152

[51] Int. Cl.$^3$ ............................................ H05K 1/09
[52] U.S. Cl. .................... 174/68.5; 75/228; 361/411
[58] Field of Search ................ 174/68.5; 361/411

[56] References Cited

U.S. PATENT DOCUMENTS

| | | | |
|---|---|---|---|
| 3,141,238 | 7/1964 | Harman, Jr. | 75/134 T |
| 3,157,539 | 11/1964 | Dreher | 75/153 |
| 3,196,007 | 7/1965 | Wilke | 75/153 |
| 3,601,523 | 8/1971 | Arndt | 174/68.5 |
| 4,015,981 | 4/1977 | Rogova et al. | 75/134 T |
| 4,233,103 | 11/1980 | Shaheen | 156/331 |
| 4,383,363 | 5/1983 | Hayakawa et al. | 174/68.5 X |

FOREIGN PATENT DOCUMENTS

| | | | |
|---|---|---|---|
| 236215 | 5/1969 | U.S.S.R. | 75/134 T |
| 293602 | 2/1971 | U.S.S.R. | 75/134 T |

*Primary Examiner*—R. R. Kucia
*Attorney, Agent, or Firm*—Hill, Van Santen, Steadman & Simpson

[57] ABSTRACT

A novel conductive paste is disclosed which is suitable for use to connect circuit patterns of a printed circuit board.

The conductive paste comprises a melt of gallium and a metal element which forms an eutectic mixture with gallium, and metal powder which alloys with gallium uniformly dispersed in the melt. The content of the metal element and the metal powder are selected to control a solid content in the paste at a predetermined working temperature.

6 Claims, 35 Drawing Figures

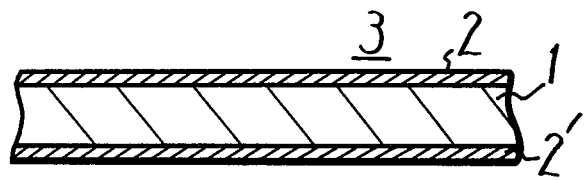
FIG. 11A
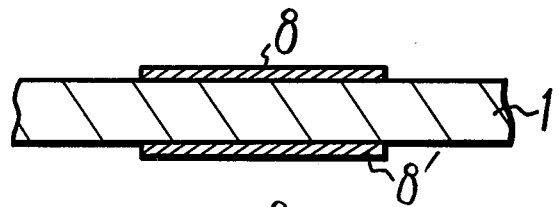
FIG. 11B
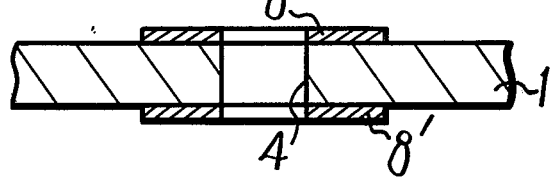
FIG. 11C
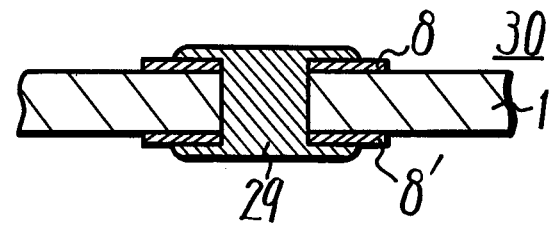
FIG. 11D
FIG. 13
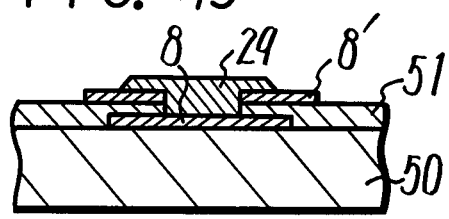
FIG. 12
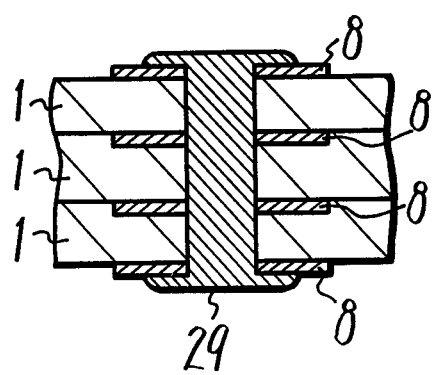
FIG. 14
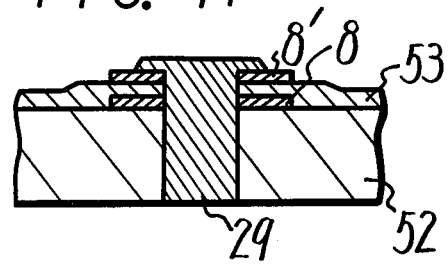

CONDUCTIVE PASTE

This is a division of Ser. No. 246,902, filed Mar. 23, 1981 and now abandoned.

BACKGROUND OF THE INVENTION

1. Field of the Invention

The present invention relates generally to a conductive paste and a method of manufacturing the same, and is directed more particularly to a conductive paste suitable for use as a so-called through-hole filter for connecting the parts between the respective circuits on the respective layers of a multi-layer printed circuit board, a connecting material between conductive circuit patterns or making a conductive pattern and a method of manufacturing the same.

2. Description of the Prior Art

A prior art multi-layer printed circuit board will be described with reference to FIG. 1 which shows the manufacturing steps thereof in sequence. As shown in FIGS. 1A and 1B, a board 1 made of an insulating material such as phenolic resin, epoxy resin or the like is prepared, and copper foils 2 and 2' are respectively adhered on the upper and lower surface of the board 1 to thereby produce a so-called copper clad laminated board 3. Then, a through-hole 4 is bored at a predetermined location of the board 3 which passes through the board 3 and the copper foils 2, 2' thereon in the vertical direction. The board 3 is subjected to electroless copper plating and then to copper electro-plating to form a copper plating layer 5 on the inner surface of the through-hole 4 and on the surfaces of the copper foils 2 and 2' as shown in FIG. 1C. Then, an etching resist 6 is charged into the through-hole 4 and etching resists 7 are respectively printed on the copper foils 2 and 2' which have the patterns corresponding to the wiring patterns to be formed as shown in FIGS. 1D and 1E. Next, as shown in FIGS. 1F and 1G, the copper foils 2 and 2' are selectively etched with the resists 6 and 7 as a mask to remove unnecessary copper foil portions and hence to form wiring patterns 8 and 8', and then the resists 6 and 7 are removed to make a multi-layer printed circuit board 10.

Another example of the prior art multi-layer printed circuit board is shown in FIG. 3. In this example, a copper clad laminated board 3 similar to that 3 shown in FIG. 1 is first subjected to selective etching to remove unnecessary copper foil portions of copper foils 2, 2' and hence to form wiring patterns 8 and 8' as shown in FIGS. 3A and 3B. Then, a through-hole 4 is bored through the board 3 at a predetermined position which also passes through the wiring patterns 8 and 8', Ag paint 9 consisting of Ag powders and binder is charged into the through-hole 4 to electrically connect both wiring patterns 8 and 8' as shown in FIGS. 3C and 3D to manufacture a multi-layer printed circuit board 11.

The multi-layer printed circuit boards 10 and 11 shown in FIGS. 1 and 3 cannot be free from the following defects.

For example, in the case of the prior art multi-layer printed circuit board 10 shown in FIG. 1, when both wiring patterns 8 and 8' are electrically connected, the plating process and so on are necessary which is rather complicated, and low in yield. Further, the waste water disposal is not easy in view of public pollution. Also, since the copper plating is carried out on the entire surfaces of the board and thereafter the wiring patterns are selectively etched, unnecessary copper plating portion is rather much or useless copper plating is rather much. Further, as shown in FIG. 2, after the copper plating layer 5 is formed, due to an under-cut phenomenon 12 upon the etching, the wiring pattern 8 (or 8') becomes thin and accordingly, the pattern accuracy is deteriorated.

In the case of the multi-layer printed circuit board 11 shown in FIG. 3, when a DC voltage is applied to the board under humidification, Ag is moved from a high voltage portion to a low voltage portion and a short-circuit is caused which is so-called as a migration phenomenon. The through-hole resistance is higher than that shown in FIG. 1 by the copper plating by 100 times and hence the circuit board 11 is poor in high frequency characteristic. Further, since the Ag paint 9 charged into the through-hole 4 contains substantial amounts of binder and solvent, as shown in FIG. 4, the volume shrinkage of Ag paint 9 after curing by heat increases and hence the circuit board 11 is lacking in reliability. Further the use of solvent causes bad working conditions.

OBJECTS AND SUMMARY OF THE INVENTION

It is an object of the present inventin to provide a novel conductive paste.

It is another object of the present invention to provide a novel conductive material.

It is a further object of the present invention to provide a novel conductive paste suitable for use with a printed circuit board.

It is a still further object of the present invention to provide a novel conductive paste suitable for connecting circuit patterns of a printed circuit board.

According to one aspect of the present invention, there is provided conductive paste which comprises a melt of gallium and a metal element which forms an eutectic mixture with gallium, and metal powder which alloys with gallium uniformly dispersed in the melt. The metal element which forms the eutectic mixture with gallium is at least 20 weight % of the melt.

According to another aspect of the present invention there is provided conductive material which comprises gallium alloy and fine metal crystal precipitated in the gallium alloy, wherein the metal is able to form an eutectic mixture with gallium.

Other objects, features and advantages of the present invention will become apparent from the following description taken in conjunction with the accompanying drawings.

BRIEF DESCRIPTION OF THE DRAWINGS

FIGS. 11A to 11D are respectively cross-sectional views showing the working steps of an example where the conductive material of the invention is employed to manufacture a multi-layer printed circuit board;

FIGS. 12, 13 and 14 are respectively cross-sectional views showing other multi-layer printed circuit boards to which the present invention can be applied.

DESCRIPTION OF THE PREFERRED EMBODIMENT

The present invention will be hereinafter described with reference to the attached drawings.

According to the present invention, a conductive paste or material is made of a mixture which consists of a melt of gallium and metal which forms a eutectic mixture with gallium and metal powder (single metal powder or alloy powder) which alloys with gallium to raise the melting point of the composition. This conductive material has such a property that it is in paste form at an initial working temperature, is thereafter alloyed and set in the lapse of time. As the metal forming an eutectic mixture with gallium, used are a combination of one or more of indium In, tin Sn, zinc Zn and bismuth Bi and preferably In, Sn. As the metal in a powder form alloying with gallium, there is used a single metal consisting of nickel Ni, cobalt Co, gold Au, copper Cu and so on or an alloy thereof, for example, Ni-Cu alloy, cobalt alloy such as a Co-Sn alloy, copper alloy such as a Cu-Sn alloy (Cu more than 40 weight %), Cu-Zn alloy (Cu more than 60 weight %), Cu-Be alloy (Cu more than 98 weight %) and so on. As the metal powder one is desired which forms no oxide layer on the surface thereof. Sn, Zn, Be and so on in the above alloys are especially preferred so as to avoid the oxidization of Cu. In this case, the grain size of the above metal powders is desired to be in the range from 0.5μ to 500μ, preferably from 1.0μ to 100μ.

In order to provide the above conductive paste, liquid gallium and solid metal forming a eutectic mixture with gallium are first weighed in suitable amount, and then they are heated in a crucible at a temperature higher than the melting point of the metal forming the eutectic mixture with gallium and rendered molten. The melt thus prepared is cooled to a predetermined working temperature, and then metal powder which alloys with gallium is added to the melt. Then, the melt added with the metal powder is well dispersed and mixed by an amalgam mixer, vibration mill, ball mill or the like to provide a desired conductive paste. In case of using the amalgam mixer, the melt is rendered to be a paste in 30 seconds or more. The melt may be mixed in a heating atmosphere.

Figure 8:
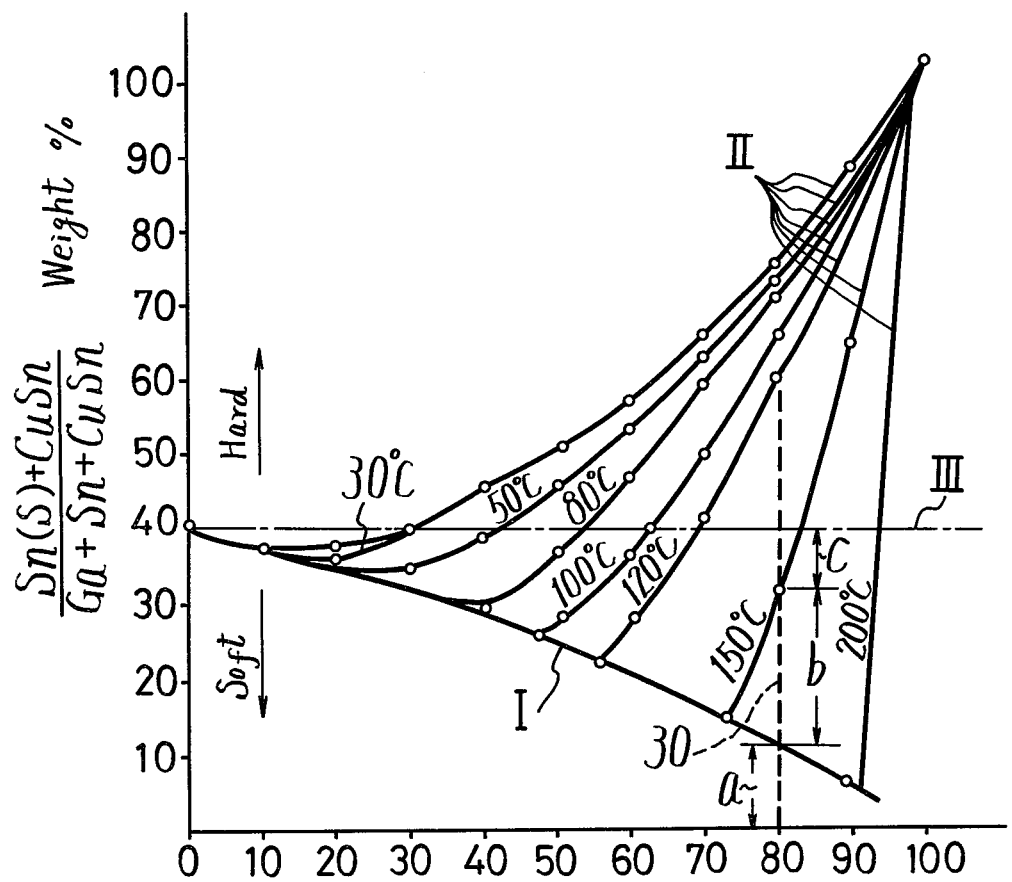
FIG. 8 is a diagram showing the relation between the alloy composition of Ga-Sn-Cu system alloy and the working temperature.
Figure 9:
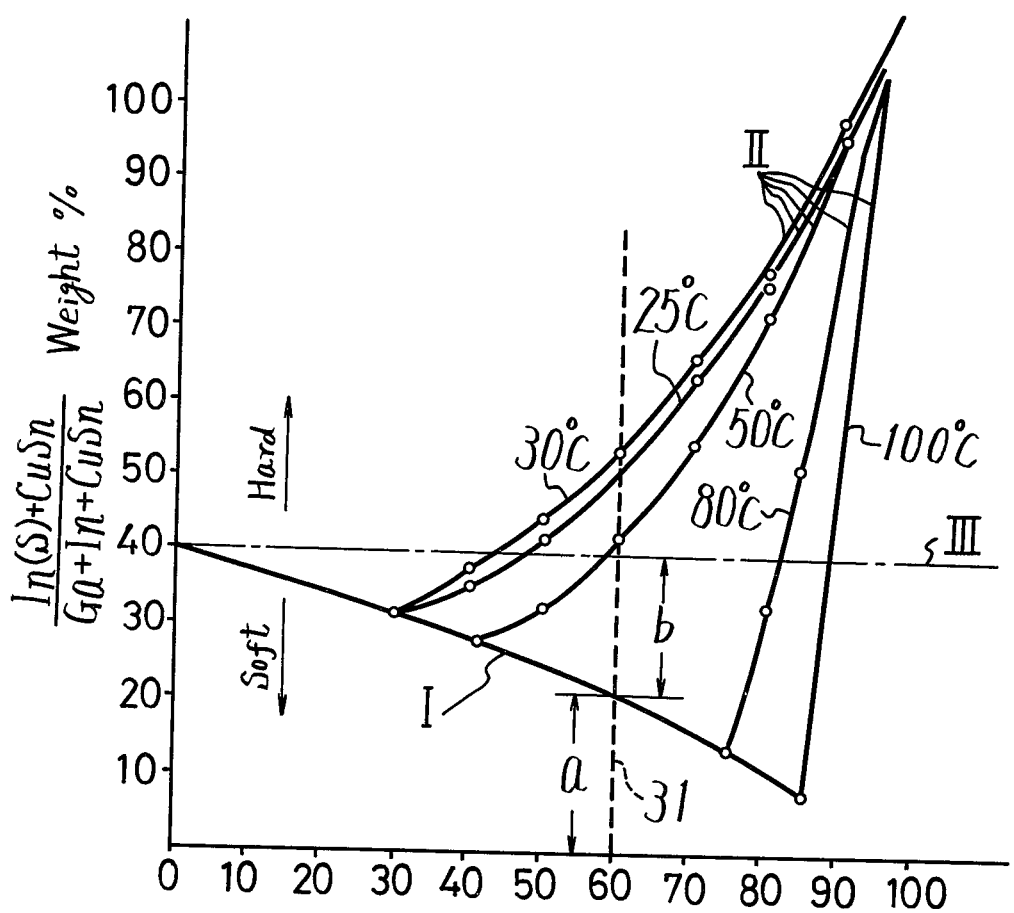
FIG. 9 is a graph showing the relation of Ga-In-Cu system alloy similar to that of FIG. 8.
Figure 10:
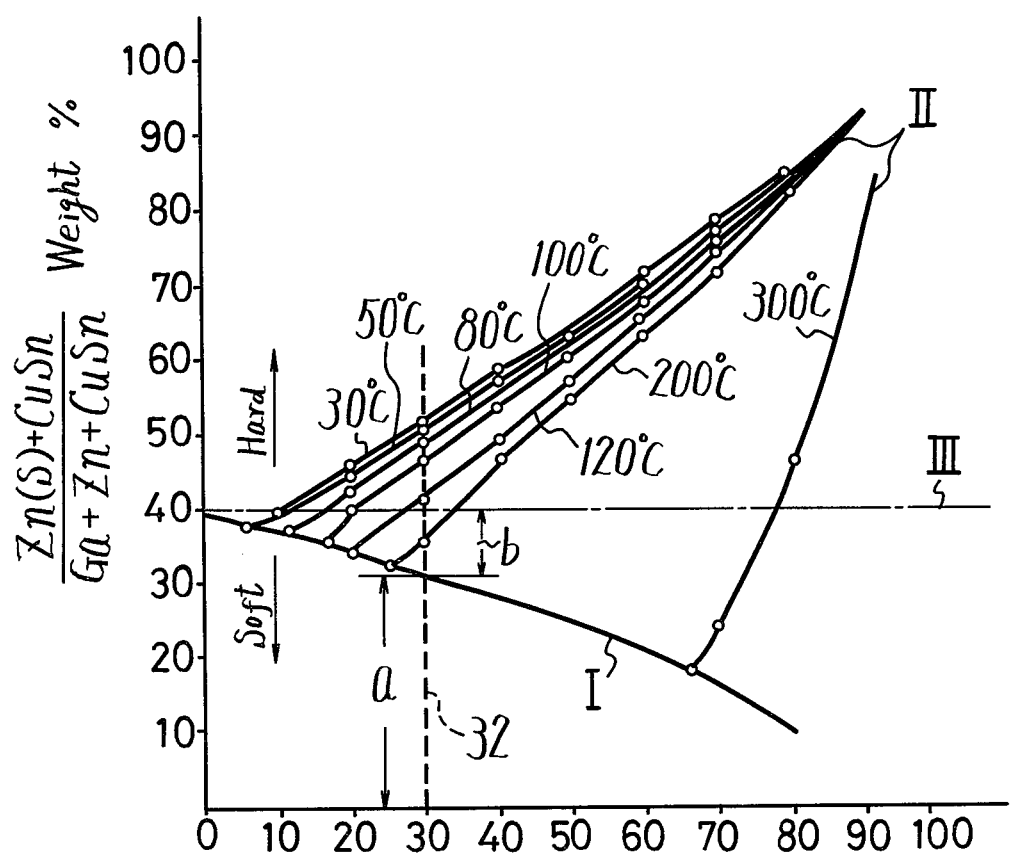
FIG. 10 is a graph showing the relation of Ga-Zn-Cu system alloy similar to that of FIG. 8.

The ratio of the respective components of the gallium metal forming eutectic mixture with the gallium and metal powder alloying with gallium is different in dependence with the kind of the metal forming eutectic mixture with the gallium, the added amount thereof and the working temperature (so-called handling temperature), but can be determined by, for example, the relative graphs between practical alloy compositions and working temperatures shown in the graphs of FIGS. 8 to 10 which will be described later.

Figure 1A:
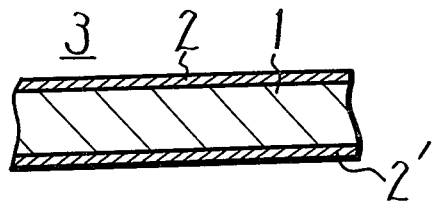
FIGS. 1A to 1G are respectively cross-sectional views showing the working steps of manufacturing an example of the prior art multi-layer printed circuit board, which is also used to explain the present invention.
Figure 1B:
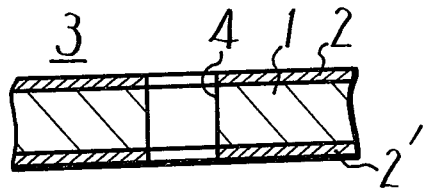
Figure 1C:
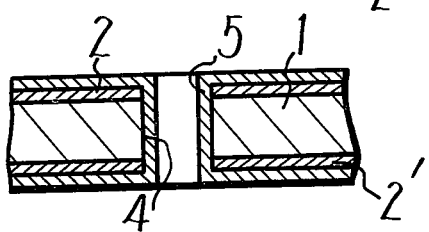
Figure 1D:
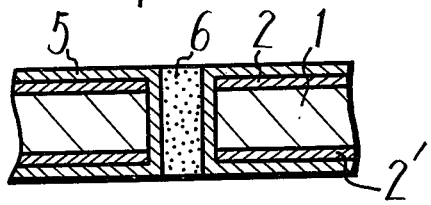
Figure 1E:
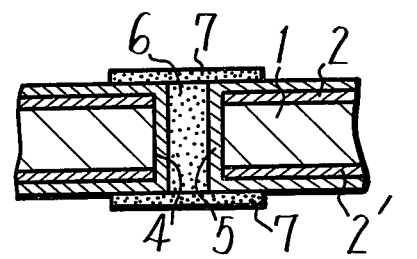
Figure 1F:
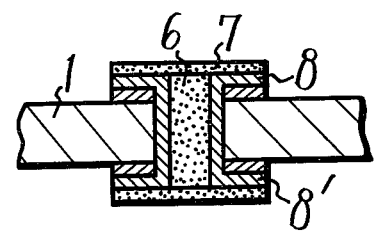
Figure 1G:
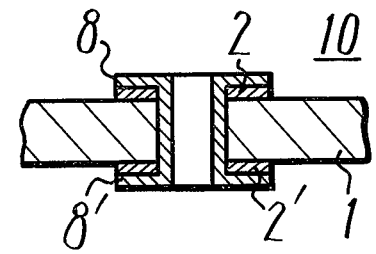
Figure 2:
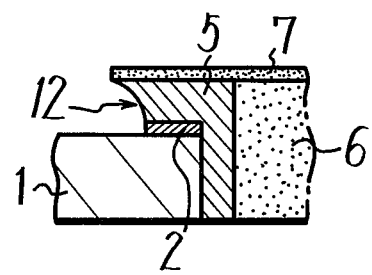
FIG. 2 is a cross-sectional view showing, in an enlarged scale, the essential of the example of the prior art shown in FIG. 1.
Figure 3A:
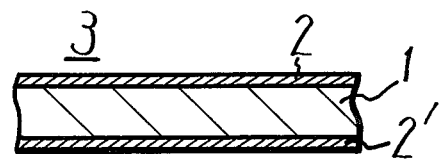
FIGS. 3A to 3D are respectively cross-sectional views showing the working steps of manufacturing another example of the prior art multi-layer printed circuit board.
Figure 3B:
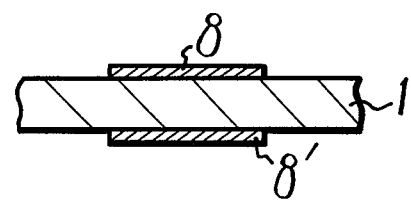
Figure 3C:
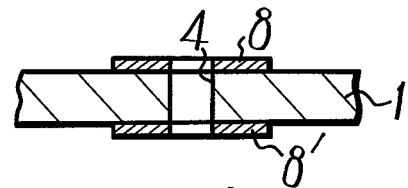
Figure 3D:
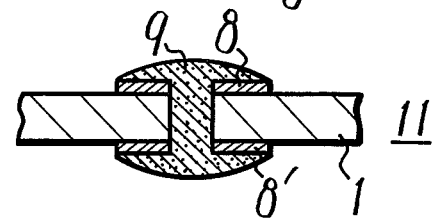
Figure 4:
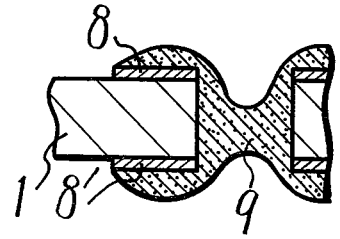
FIG. 4 is a cross-sectional view showing, in an enlarged scale, the essential part of another example of the prior art shown in FIG. 3.
Figure 5:
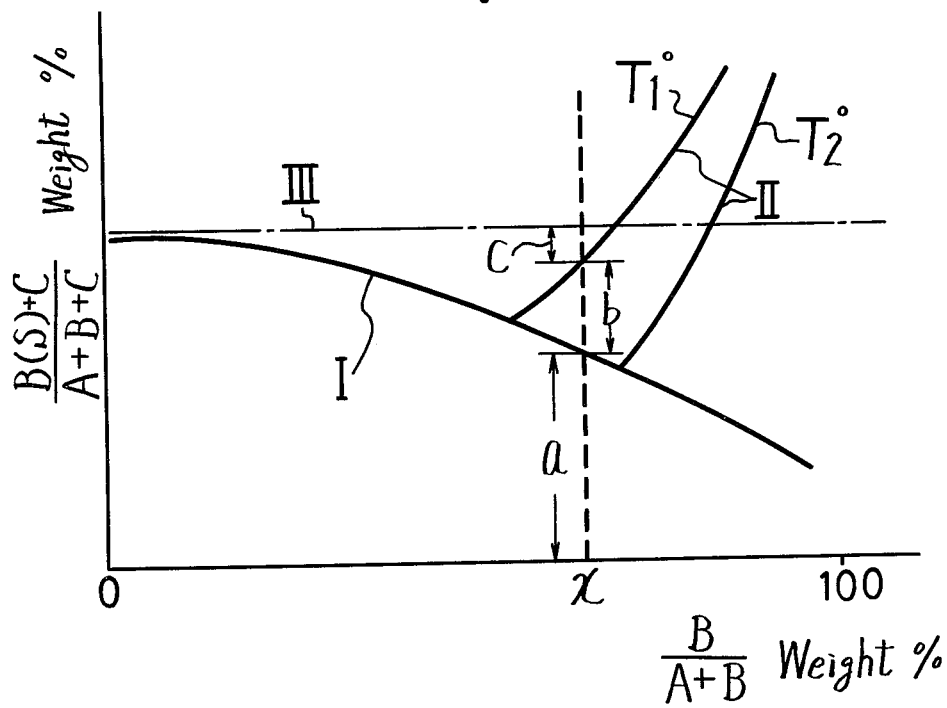
FIG. 5 is a graph showing the relation between the alloy composition and the working temperature which is used to explain the invention.

FIG. 5 is a graph showing the relation between a generalized alloy composition and a working temperature. In the graph of FIG. 5, it is assumed that the gallium is taken as an A component, the metal forming the eutectic mixture with the gallium as a B component and the metal powder alloying with the gallium as a C component, and the abscissa represents the weight ratio $$\frac{B}{A+B}$$

and the ordinates represents the weight ratio $$\frac{B(s)+C}{A+B+C}$$

where B(s) is the amount of the precipitated crystals of B component and C is the metal powder added for alloying. In the graph of FIG. 5, a curve I shows the minimum amount of the C component necessary for reacting with the A component, curves II shows the relation between the adding amount of the B component for the total amount of $$A+B\left(\frac{B}{A+B}\right)$$

and the precipitated amount B(s) for the total amount $$A+B_s\left(\frac{B(s)}{A+B}\right)$$

with respective working temperatures ($T_1$ °C., $T_2$ °C., ...) as parameters, and a curve III shows the optimum paste condition of the conductive material or its optimum solid content ratio $$\frac{B(s)+C}{A+B+C}$$

thereof in view of working which represents the optimum softness of the paste. Accordingly, if the ratio of the B component is taken as x and the working temperature is selected as $T_1$ °C., by way of example, the necessary minimum amount of the C component becomes a, the precipitated amount of the B component becomes b and the adjusting amount of the C component for obtaining the optimum paste condition becomes c. Thus, the adding amount of the C component is necessary to be a+c.

The ratio $$\frac{B}{A+B}$$

can be increased as the working temperature becomes high. In fact, depending upon the alloy composition, the ratio is desired in the amount more than 20 weight % limited at the temperature of 120° C. which is a desired critical working temperature, or preferred in the range, for example, lower than 70 weight % in case of Sn or lower than 90 weight % in case of In. If the amount is less than 20 weight %, the malleability after hardening of the paste becomes poor and hence the conductive material thus hardened becomes brittle.

The adding amount of the C component can be obtained from the B component and the working temperature and is required to be such an amount that it makes at least the gallium as a complete gallium compound with B component and makes the solid content ratio $$\frac{B(s)+C}{A+B+C}$$

as 30 to 50% in weight at the working temperature. In general, the adding amount of the C component is desired to be more than 10 weight parts but lower than 50 weight parts for the 100 weight parts of the sum of the A and B components. When the adding amount of the C component is less than 10 weight parts, there remains gallium which is not reacted and hence the paste does not harden. While, when the adding amount of the C component exceeds 50 weight parts, no paste condition is presented and accordingly, the conductive material can not be charged.

The solid content ratio of the conductive material, $$\frac{B(s)+C}{A+B+C}$$

in weight ratio is selected, more than 30% but less than 50%, preferably about 40%. The working temperature is possible in the range between $-10°$ C. and 120° C., more preferably between 20° C. and 80° C.

The mixing temperature of the A, B and C components is determined by the relative graph between the alloy composition and working temperature but is different depending upon mainly the kinds of the B component and the adding amount thereof (refer to the examples shown in the graphs of FIGS. 8 to 10 in which the B component is selected as Sn, In and Zn). The mixing temperature is such a temperature that the mixed components hold their liquid phase and is desired in the range lower than the optimum paste condition curve I in the graph of FIG. 5.

The following table shows desirable mixing temperature in the case where Sn is used.

TABLE

| $\frac{Sn}{Ga+Sn}$ | 30% | 40% | 50% | 70% |
|---|---|---|---|---|
| Mixing Temperature | Higher than 30° C. | Higher than 50° C. | Higher than 80° C. | Higher than 120° C. |

In such a case where the B component is plural, the mixing temperature becomes rather low.

Figure 7:
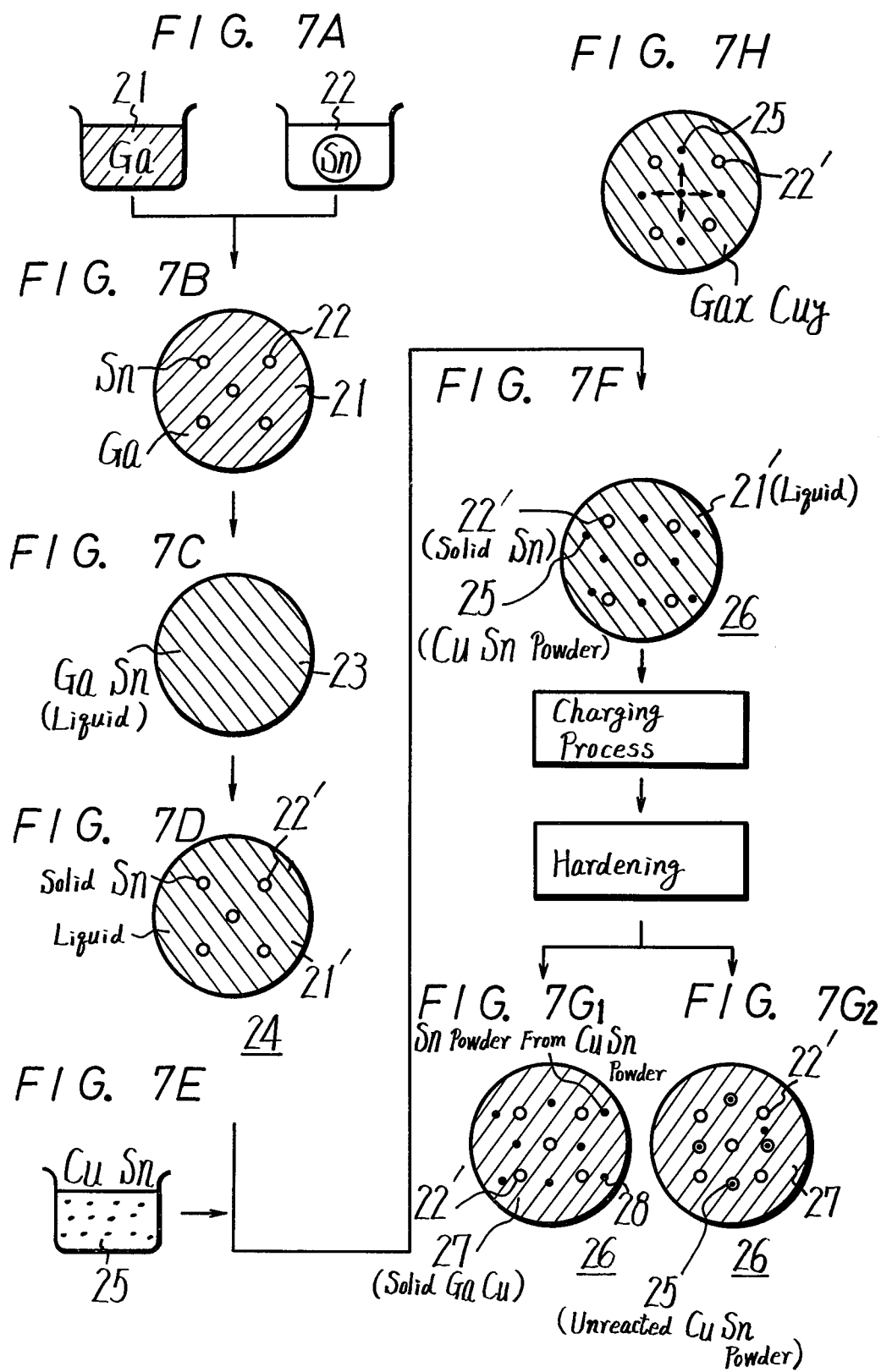
FIGS. 7A to 7H are respectively diagrams used to show an example of the conductive material according to the present invention from its manufacturing to hardening after being charged.

FIG. 7 shows the working steps of the conductive material made of Ga-Sn-Cu alloy according to the present invention. At first, as shown in FIGS. 7A and 7B, liquid Ga 21 and solid Sn 22 are respectively weighed and then mixed. After the mixture is heated to be a melt, this GaSn liquid phase 23 (refer to FIG. 7C) is cooled to a predetermined working temperature. At the working temperature, in the mixture or melt 24 there exist a liquid phase 21' of Ga-Sn whose main component is Ga and a solid phase 22' whose main component is Sn which contains a small amount of Ga, respectively, as shown in FIG. 7D. The mixture of melt 24 of Ga and Sn is mixed with a suitable amount of CuSn alloy powder 25 as shown in FIG. 7E to provide a conductive material 26 in paste condition as shown in FIG. 7F. In this paste or conductive material 26, there exists the solid phase 22' whose main component is Sn, the liquid phase 21' whose main component is Ga and CuSn powder 25 respectively.

Next, the paste or conductive material 26 is charged into a desired portion of the circuit board, and thereafter is hardened. This hardening phenomenon is one such as that shown in FIG. 7H. Cu in CuSn powder 25 is dispersed to produce an alloy expressed by the composition of $Ga_xCu_y$, and the paste 26 is alloyed and hardened (the melting point of which is increased). During this hardening, if, for example, the amount of CuSn powder 25 is suitably selected, as shown in FIG. 7G, the solid phase 22' whose main component is Sn, solid phase 27 whose main component is GaCu and Sn powder 28 originated in the CuSn powder 25 respectively exist in the conductive material 26. If the CuSn powder 25 is excessive, the solid phase 22' whose mains component is Sn, the solid phase 27 whose main component is GaCu and CuSn powder 25 which is not reacted exist in mixed state. In such a hardened state of the conductive material 26, almost all mixed Sn is precipitated as Sn, Cu which is not reacted with Ga is also precipitated, and Sn serves a binder for brittle GaCu compound.

FIGS. 8 to 10 are graphs respectively showing the relations between the alloy composition and the working temperature in which the curves with the references same as those of the graphs of FIG. 5 represent the corresponding characteristics, respectively. In the following examples, since Cu-Sn alloy (containing 90 weight % Cu and 10 weight percent Sn) powder was used instead of pure Cu powder, line I is modified in FIGS. 8 to 10 considering the 10 weight % Sn in Cu-Sn alloy powder.

FIG. 8 shows the relation of Ga-Sn-Cu system alloy. As the metal powder which alloys with Ga alloy powder of Cu 90 weight % -Sn 10 weight % is employed. According to the graph of FIG. 8, when the Sn 80 weight % and Ga 20 weight % are mixed and melted at, for example, 235° C. and the working temperature is selected as 150° C., the crystalized part b of Sn is 20 weight %, minimum necessary part a of Cu-Sn powder which reacts with Ga is 11 weight % and paste property adjusting part c of Cu-Sn powder is 8 weight % as indicated by a dotted line 30. Hence Cu-Sn powder of totally 19 weight % is necessary. That is, it is sufficient that 19 weight parts of Cu-Sn powder is added to the melt consisting of 80 weight parts of Sn and 20 weight parts of Ga. Accordingly, the respective composition ratios of Ga-Sn-Cu alloy under the above condition are obtained. In the graph of FIG. 8, the paste in the region above the optimum paste state line III becomes hard, while the paste in the region below the line III becomes soft. Accordingly, if the above composition is dealt at a temperature lower than 150° C., the paste becomes hard, but if the composition is dealt at a temperature higher than 150° C., the paste becomes too soft and hence the paste become hard to be charged.

FIG. 9 shows the relation of Ga-In-Cu system alloy. In this case, the CuSn powder same as that in the case of FIG. 8 is used. According to the graph of FIG. 9, when In 60 weight % and Ga 40 weight % are mixed and melted at, for example, 156° C. and the working temperature is selected as 50° C., the crystalized part b of In is 21 weight % minimum necessary part a of Cu-Sn powder which reacts with Ga is 21 weight %, and paste property adjusting part c becomes zero as indicated by a dotted line 31. Accordingly, the respective composition ratios of Ga-In-Cu alloy under the above condition are obtained. When the above composition alloy is dealt at 30° C., the paste becomes hard (the crystal component of In increases), while when the same alloy is dealt at 80° C., the paste becomes soft. Therefore, in such the case, the composition must be varied.

FIG. 10 shows the relation of Ga-Zn-Cu system alloy. In this case, the CuSn powder same as that in the case of FIG. 8 is used. According to the graph of FIG. 10, when Ga 70 weight % and Zn 30 weight % are mixed and melted at, for example, 420° C. and the working temperature is selected as 120° C., the crystalized part b of Zn is 10 weight %, minimum necessary part a of Cu-Sn powder which reacts with Ga is 31 weight %, and paste property adjusting part c becomes zero as indicated by a dotted line 32. Accordingly, the respective composition ratios of Ga-In-Cu alloy under the above condition are obtained. When the working temperature is selected at 150° C., the crystalized Zn amount b becomes 5 weight %, Cu amount a necessary for reacting with Ga becomes 31 weight % and the adjusting amount c for the paste state becomes 4 weight %, respectively. Accordingly, the respective composition ratios of the Ga-Zn-Cu alloy in response to the respective conditions is obtained from the graph of FIG. 10.

Turning to FIG. 11, an example of the invention will be described in which the conductive material of the invention described as above is used to make a multi-layer printed circuit board. First, as shown in FIG. 11A, a so-called copper clad laminate 3 is prepared which consists of an insulating board 1 made of, for example, phenolic resin, epoxy resin or the like and copper foils 2 and 2' adhered on the upper and lower surfaces of the board 1. Then, the upper and lower copper foils 2 and 2' of the laminate 3 are selectively etched away to form predetermined wiring patterns 8 and 8' on both surfaces of the board 1 as shown in FIG. 11B. Then, a through-hole 4 is bored at a predetermined position through the board 1 which passes through also the wiring patterns 8 and 8' as shown in FIG. 11C. Thereafter, the conductive material of the paste form, consisting of Ga, the metal forming eutectic mixture with Ga and the metal powder alloying with Ga as set forth above, is charged into the through-hole 4 and then the conductive material is alloyed to provide a conductor 29 which electrically connects both the wiring patterns 8 and 8'. Thus, a desired multi-layer printed circuit board 30 is made as shown in FIG. 11D.

Figure 15:
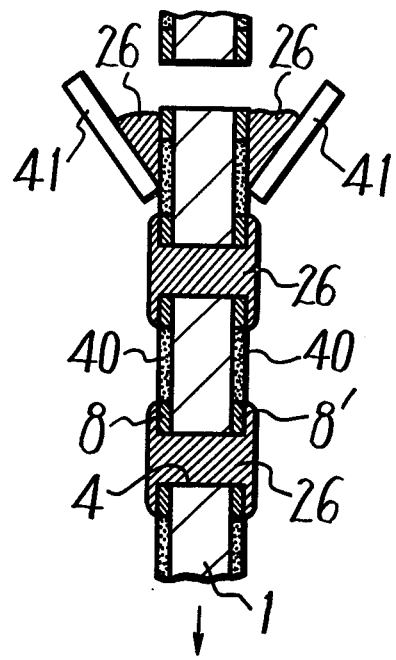
FIGS. 15 and 16 are respectively cross-sectional views showing the manner to charge the conductive material of the present invention into the through-hole.

The charging of the conductive material into the through-hole 4 is such that, as described above, the conductive material is heated at the working temperature responsive to the alloy composition thereof and then charged into the through-hole 4. For example, as shown in FIG. 15, the board 1, which is provided with the copper patterns 8, 8', through-hole 4 and resist layers 40 coated on the surfaces of the board 1 where patterns 8, 8' are not formed, is located between two fixed squeezes 41. Then, while the board 1 is moved in the direction indicated by the arrow, the conductive material 26 is charged into the through-hole 4. In this case, the conductive material 26 does not adhere to the organic coating layer making the resist 40 but is coated on the copper patterns 8, 8' good in wettability and charged into the through-hole 4.

Figure 16:
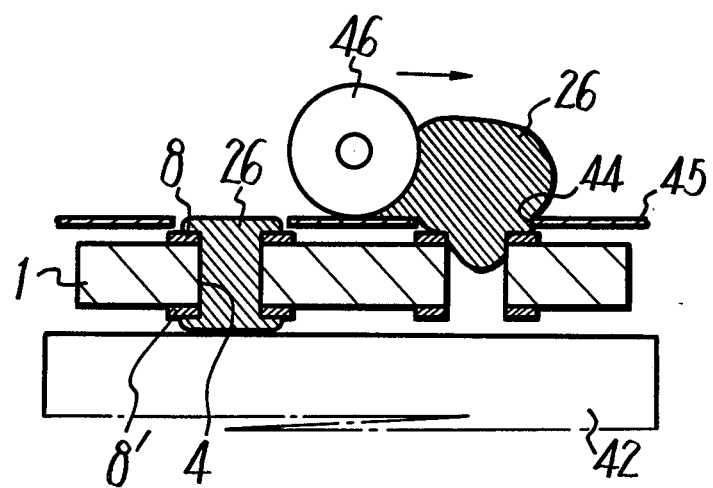

Further, as shown in FIG. 16, the board 1 provided with the copper patterns 8, 8' and through-hole 4 is located on a hot plate 42, and a mask 45, which is made of a metal sheet of stainless steel or vinyl chloride and which has bores 44 at the position corresponding to the region including the through-hole 4 and a part of the copper pattern 8, is fixed above one surface of the board 1. The conductive material 26 is charged above the mask 45 through a roller 46 made of, for example, silicone gum. After the charging of the conductive material 26, if the mask 45 is removed, the conductive material 26 is positively charged into only a necessary portion including the through-hole 4 and does not adhere to the other portion. In this case, it is desired that after the conductive material 26 is charged into the through-hole 4, parts of the conductive material 26 protruded from the through-hole 4 are removed and smoothed, if necessary.

Figure 6:
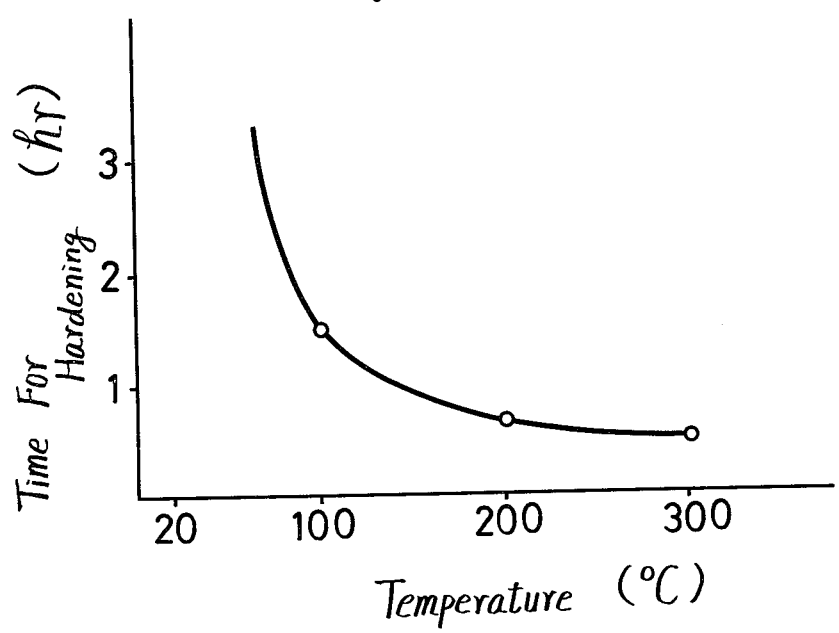
FIG. 6 is a graph showing the relation between the heating temperature of the conductive paste according to the invention and time until the conductive paste hardened.

After the charging of the conductive material 26 into the through-hole 4, it becomes set at the room temperature or under the heating condition in time lapse and loses its paste property. The relation between the temperature for hardening and the time in this case is shown in the graph of FIG. 6. For example, the conductive material 26 becomes hardened in 48 hours at 20° C. but 40 minutes at 150° C.

It was ascertained that after the conductive material 26 was charged and cured and the circuit board 30 (refer to FIG. 11D) was immersed in a soldering bath (the temperature of the solder is 240° C.) in 10 seconds, no change occurred in the hardened conductive material i.e. hardened conductor 29. Further, it was also ascertained that after such a cycle that the circuit board 30 was immersed in the silicone oil at 260° C. in 5 seconds and then immersed in trichloroethane solution at 20° C. was repeated 10 times, no change occurred in the through-hole resistance value or the cross-section shape of the cured conductive material. Also, the resistance value between the wiring patterns formed on the upper and lower surfaces of the board through the through-hole was 0.2 mΩ similar to the copper plated through-hole.

Further, a paper board impregnated with phenolic resin was provided with two through-holes with the distance of 5 mm, the above conductive material of the invention was charged into the two through-holes and then hardened, thereafter DC 100 V is applied across each of the conductors in the two through-holes, and then it was left in 48 hours under the condition of 95% a relative humidity at 40° C. After the above test, no electro migration phenomenon occurred and the insulating property was not deteriorated.

As described above, when the conductive material according to the present invention is used as the through-hole charging material of the multi-layer printed circuit board, as compared with the prior art plated through hole method, the manufacturing process thereof can be shortened, the yield and cost of the product become good, and no waste water disposal is necessary and hence the process becomes non-public pollution process since this invention requires no plating process.

Further, when the present invention is compared with the silver through hole method by which silver paint is charged into the through-hole, the reliability can be improved at every point by the invention. The through-hole resistance value of the invention is less than that of the silver through-hole method by 1/100 or more so that the invention is good in high frequency characteristic, has no electro migration phenomenon and can be utilized in a wide range in view of the circuit design since the invention contains no silver component.

Further, the conductive material of the invention does not contain any volatile component in its paste, so that no shrinkage is generated upon hardening of the paste, and no dropping of the charged conductive material and no deterioration of the connection of the conductive material to the copper foil occur to improve the reliability.

According to the present invention it was also ascertained that metal which forms eutectic mixture with gallium was contained much in the conductor and gallium reacts with the third added metal, for example, copper in the example and hardened, so that brittle Ga-Cu intermetallic component was dispersed in the metal which forms eutectic mixture with gallium to present malleability.

In the example shown in FIG. 11, the conductive material according to the present invention is applied to the 2-layer printed circuit board with the wiring patterns 8 and 8' on the both surfaces of the board 1. However, the conductive layer according to the invention can be of course applied to a so-called multi-layer printed circuit board such as a circuit board which is provided with the wiring patterns 8 as four layers as shown in FIG. 12, to a simple type circuit board which consists of an insulating board 50 and a first wiring pattern 8, an insulating layer 51 and a second wiring pattern 8' formed sequentially on the insulating board 50 as shown in FIG. 13, a simple type circuit board which consists of a hard insulating board 52, a first wiring pattern 8 formed thereon and a flexible circuit board 53 which comprises a flexible insulating board with a second wiring pattern 8' thereon formed on the first wiring pattern 8 as shown in FIG. 14, and so on.

In the above examples, the conductive material according to the invention is employed as the charging material for the through-hole of a multi-layer printed circuit board. The conductive material of the invention can be also used as an ordinary soldering material and further employed in such a case where the conductive layer (wires) with a desired pattern is formed on a predetermined board by the printing.

As described above, since the conductive material according to the present invention is of the paste state at the working temperature, is capable of being charged into a bore and hole, has no shrinkage in volume after hardening thereof and is very low in resistance value, the conductive material of the invention is especially suitable as conductive material which is required to be charged or printed. For example, when the conductive material of the invention is employed as the charging material into the through-hole of the multi-layer printed circuit board, the multi-layer printed circuit board can be easily manufactured and the circuit board thus manufactured is high in reliability.

It will be apparent that many modifications and variations could be effected by one skilled in the art without departing from the spirits or scope of the novel concepts of the present invention so that the spirits or scope of the invention could be determined by the appended claims only.

We claim as our invention:

1. A printed circuit board comprising:
   an insulating substrate,
   a first conductive pattern located on one surface of said substrate,
   a second conductive pattern insulated from said first conductive pattern, and
   a conductive material electrically connecting said two conductive patterns together, said conductive material being formed of a conductive paste comprising a melt of gallium and a metal element which forms a eutectic mixture with gallium, said melt containing at least 20 weight parts of said metal element for 100 weight parts of said melt, and a metal powder which alloys with gallium uniformly dispersed in said melt, said metal powder being present in an amount of between 10 and 50 weight parts for 100 weight parts of said melt, the amount of said metal element and said metal powder providing a solids content in said conductive paste between 30 to 50% by weight at a predetermined temperature, said conductive paste being alloyed and hardened.

2. A printed circuit board according to claim 1 in which said metal element is at least one of the following: In, Sn, Zn, or Bi.

3. A printed circuit board according to claim 1 in which said metal powder contains at least one of the elements Ni, Co, Au, or Cu as its main component.

4. A printed circuit board according to claim 1 wherein said metal powder is a Co-Sn alloy, a Cu-Sn alloy, a Cu-Zn alloy, or a Cu-Be alloy.

5. A printed circuit board according to claim 1 wherein said metal powder has a size between 0.5 and 500 microns.

6. A printed circuit board according to claim 5 wherein said metal powder has a size between 1 and 100 microns.

* * * * *